(12) United States Patent
Takahashi

(10) Patent No.: US 10,926,288 B2
(45) Date of Patent: Feb. 23, 2021

(54) COATING METHOD, COATING APPARATUS AND RECORDING MEDIUM

(71) Applicant: Tokyo Electron Limited, Tokyo (JP)

(72) Inventor: Teppei Takahashi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/016,786

(22) Filed: Jun. 25, 2018

(65) Prior Publication Data

US 2018/0369856 A1    Dec. 27, 2018

(30) Foreign Application Priority Data

Jun. 27, 2017 (JP) .............................. JP2017-125015

(51) Int. Cl.
| | | |
|---|---|---|
| H01L 21/02 | (2006.01) | |
| H01L 21/027 | (2006.01) | |
| B05D 1/00 | (2006.01) | |
| B05C 5/00 | (2006.01) | |
| G03F 7/16 | (2006.01) | |
| H01L 21/67 | (2006.01) | |

(52) U.S. Cl.
CPC .............. B05D 1/005 (2013.01); B05C 5/002 (2013.01); G03F 7/162 (2013.01); H01L 21/0273 (2013.01); H01L 21/02282 (2013.01); H01L 21/6715 (2013.01); H01L 21/67178 (2013.01)

(58) Field of Classification Search
CPC ....................................................... B05D 1/40
See application file for complete search history.

(56) References Cited

U.S. PATENT DOCUMENTS

| | | | | |
|---|---|---|---|---|
| 2011/0052807 A1* | 3/2011 | Ichino | ..................... | G03F 7/162 427/240 |
| 2016/0167079 A1* | 6/2016 | Hasimoto | ........... | H01L 21/6715 700/283 |

FOREIGN PATENT DOCUMENTS

| | | | |
|---|---|---|---|
| JP | 2003136010 A | * | 5/2003 |
| JP | 2016-115693 A | | 6/2016 |

* cited by examiner

*Primary Examiner* — Kenneth Parker
*Assistant Examiner* — Christopher A Culbert
(74) *Attorney, Agent, or Firm* — Pearne & Gordon LLP

(57) ABSTRACT

A coating sequence includes supplying a resist liquid onto a wafer under a condition that a liquid puddle of the resist liquid is formed at a central portion thereof; supplying, while rotating the wafer at a first rotation speed where the liquid puddle stays at an inner side than an edge of the wafer, a diluting liquid and moving a supply position of the diluting liquid from an outside of the liquid puddle to an edge portion thereof; moving, after the moving of the supply position from the outside to the edge portion, the supply position from the edge portion to the outside while continuously rotating the wafer at the first rotation speed; and rotating, after the moving of the supply position from the edge portion to the outside, the wafer at a rotation speed higher than the first rotation speed to diffuse the resist liquid toward the edge.

8 Claims, 14 Drawing Sheets

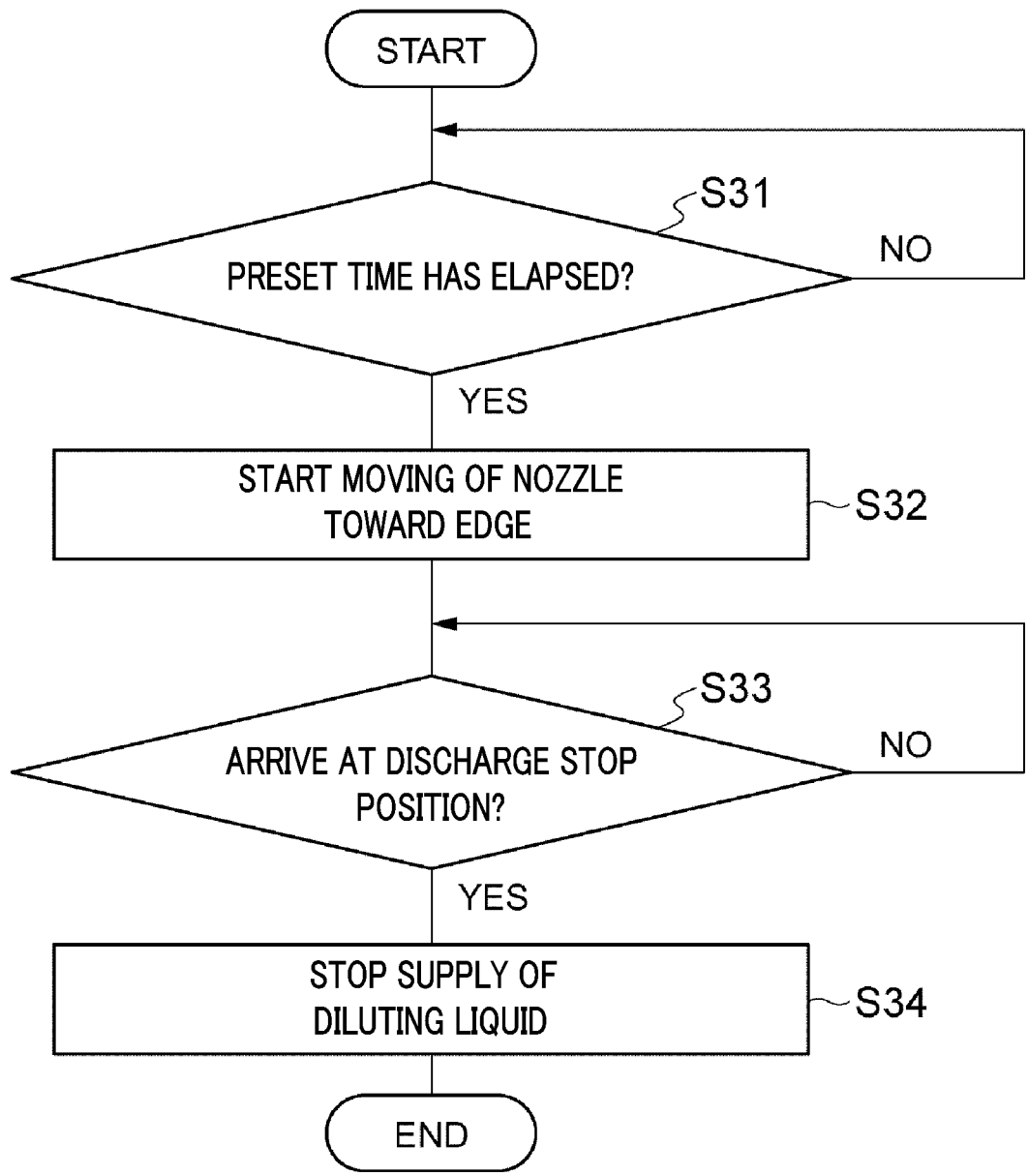

COATING METHOD, COATING APPARATUS AND RECORDING MEDIUM

CROSS-REFERENCE TO RELATED APPLICATION

This application claims the benefit of Japanese Patent Application No. 2017-125015 filed on Jun. 27, 2017, the entire disclosures of which are incorporated herein by reference.

TECHNICAL FIELD

The embodiments described herein pertain generally to a coating method, a coating apparatus and a recording medium.

BACKGROUND

Patent Document 1 describes a coating method including forming a liquid film of a solvent on a peripheral portion of a wafer in a ring shape, supplying a coating liquid onto a central portion of the wafer while rotating the wafer at a first rotation speed, and diffusing the coating liquid by rotating the wafer at a second rotation speed higher than the first rotation speed.

Patent Document 1: Japanese Patent Laid-open Publication No. 2016-115693

SUMMARY

Exemplary embodiments provide a coating method and a coating apparatus effective to form a liquid film on a surface of a substrate with high film thickness uniformity, and a recording medium.

In one exemplary embodiment, a coating method includes supplying a processing liquid onto a surface of a substrate under a condition that a liquid puddle of the processing liquid is formed at a central portion of the surface of the substrate; supplying, while rotating the substrate at a first rotation speed set to allow the liquid puddle to stay at an inner side than an edge of the substrate, a diluting liquid onto the surface of the substrate and moving a supply position of the diluting liquid from an outside of the liquid puddle to an edge portion of the liquid puddle; moving, after the moving of the supply position of the diluting liquid from the outside of the liquid puddle to the edge portion of the liquid puddle, the supply position of the diluting liquid from the edge portion of the liquid puddle to the outside of the liquid puddle while continuing to rotate the substrate at the first rotation speed; and rotating, after the moving of the supply position of the diluting liquid from the edge portion of the liquid puddle to the outside of the liquid puddle, the substrate at a rotation speed higher than the first rotation speed to allow the processing liquid to be diffused toward the edge of the substrate.

According to this coating method, after the liquid puddle of the processing liquid is formed at the central portion of the surface of the substrate, the supply position of the diluting liquid gradually advances from the outside of the liquid puddle into the edge portion of the liquid puddle, and, afterwards, gradually retreats from the edge portion of the liquid puddle to the outside thereof. Accordingly, the edge portion of the liquid puddle can be diluted with high uniformity. Thereafter, as the substrate is rotated at the rotation speed higher than the first rotation speed, the mixed solution at the edge portion of the liquid puddle is diffused toward the edge of the substrate, and the processing liquid of the liquid puddle is diffused toward the edge of the substrate additionally. As stated above, since the edge portion of the liquid puddle is diluted with high uniformity and viscosity of the mixed solution is lower than that of the processing liquid, the mixed solution is diffused toward the edge of the substrate with high uniformity. By being guided by this mixed solution, the processing liquid is also diffused toward the edge of the substrate with high uniformity. Therefore, this coating method is advantageous when it is applied to form the liquid film on the surface of the substrate with high film thickness uniformity.

The forming of the liquid puddle of the processing liquid at the central portion of the surface of the substrate may include supplying, while rotating the substrate at a second rotation speed equal to or higher than the first rotation speed, the processing liquid onto the surface of the substrate under a condition that the liquid puddle of the processing liquid is formed at a first region including a rotation center of the substrate and the processing liquid is suppressed from adhering to a second region at an outer side than the first region. The moving of the supply position of the diluting liquid from the outside of the liquid puddle to the edge portion of the liquid puddle may include moving the supply position of the diluting liquid from the second region to an edge portion of the first region. The moving of the supply position of the diluting liquid from the edge portion of the liquid puddle to the outside of the liquid puddle may include moving the supply position of the diluting liquid from the edge portion of the first region to the second region. In this case, by forming the liquid puddle of the processing liquid on the surface of the substrate while rotating the substrate at the second rotation speed, the liquid puddle having high uniformity in the circumferential direction can be formed at the first region. Further, by setting the first rotation speed, that is, the substrate rotation speed when the supply position of the diluting liquid is moved to be equal to or less than the second rotation speed, that is, the substrate rotation speed when the liquid puddle of the processing liquid is formed, the diffusion of the processing liquid can be more securely suppressed while the supply position of the diluting liquid is moved. Therefore, the liquid puddle having the high uniformity in the circumferential direction can be maintained. As a result, when the supply position of the diluting liquid advances into the first region from the second region, the edge portion of the liquid puddle can be diluted with higher uniformity.

The rotating, after the moving of the supply position of the diluting liquid from the edge portion of the liquid puddle to the outside of the liquid puddle, of the substrate at the rotation speed higher than the first rotation speed may include rotating the substrate at a third rotation speed which is higher than the first rotation speed and allows a mixed solution of the processing liquid and the diluting liquid to be diffused toward the edge of the substrate, and rotating, after the rotating of the substrate at the third rotation speed, the substrate at a fourth rotation speed which is higher than the third rotation speed and allows the processing liquid to be diffused toward the edge of the substrate. In this case, by increasing the rotation speed in stages, the phenomenon that the mixed solution is first diffused to guide the processing liquid can occur more conspicuous.

A supply of the diluting liquid onto a position at the inner side than the edge of the substrate may be started before the moving of the supply position of the diluting liquid from the second region to the edge portion of the first region. In this case, as compared to the case of starting the supply of the diluting liquid at an outer side than the edge of the substrate, a moving distance for allowing the supply position of the diluting liquid to be advanced into the first region can be shortened. Therefore, the processing time can be reduced.

The supply of the diluting liquid may be started while controlling the rotating holding unit to set the rotation speed of the substrate to be a fifth rotation speed lower than the first rotation speed. In this case, the splash of the liquid can be suppressed when the diluting liquid first arrives on the substrate, and occurrence of an unexpected phenomenon, e.g., the splashed diluting liquid is mixed into the liquid puddle or the like, can be suppressed.

The substrate may be rotated at the fifth rotation speed one or more rounds after the supply of the diluting liquid is started and before the moving of the supply position of the diluting liquid is started. In this case, a coating state of the diluting liquid onto the second region in the circumferential direction can be suppressed from being non-uniform. Therefore, when the substrate is rotated at the third rotation speed, the mixed solution can be diffused toward the edge of the substrate with higher uniformity.

After the moving of the supply position of the diluting liquid from the edge portion of the first region to the second region, the supply of the diluting liquid may be stopped in a state that the supply position of the diluting liquid is located at the inner side than the edge of the substrate. In this case, as compared to the case of stopping the supply of the diluting liquid at the outer side than the edge of the substrate, a moving distance for allowing the supply position of the diluting liquid to be retreated from the first region can be shortened. Therefore, the processing time can be further reduced.

The supply of the processing liquid onto the surface of the substrate may be started in a state that the surface of the substrate is dried, and the supply of the diluting liquid may be started in a state that the second region is dried. In this case, as compared to the case of supplying the processing liquid in the state that the surface of the substrate is wet, uniformity of a radius (a distance from the rotation center of the substrate to the edge of the liquid puddle) of the liquid puddle in the circumferential direction can be improved. The improvement of the uniformity of the radius of the liquid puddle contributes to the improvement of the uniformity of the film thickness of the liquid film.

In another exemplary embodiment, a coating apparatus includes a rotating/holding unit configured to hold and rotate a substrate; a processing liquid supply unit configured to supply a processing liquid onto a surface of the substrate; a diluting liquid supply unit configured to supply a diluting liquid onto the surface of the substrate; and a control unit. The control unit includes a liquid puddle formation control unit configured to control the processing liquid supply unit to supply the processing liquid onto the surface of the substrate under a condition that a liquid puddle of the processing liquid is formed at a central portion of the surface of the substrate; a first dilution control unit configured to control, after the control by the liquid puddle formation control unit, while controlling the rotating/holding unit to rotate the substrate at a first rotation speed set to allow the liquid puddle to stay at an inner side than an edge of the substrate, the diluting liquid supply unit to supply the diluting liquid onto the surface of the substrate and to move a supply position of the diluting liquid from an outside of the liquid puddle to an edge portion of the liquid puddle; a second dilution control unit configured to control, after the control by the first dilution control unit, while controlling the rotating/holding unit to continue to rotate the substrate at the first rotation speed, the diluting liquid supply unit to move the supply position of the diluting liquid from the edge portion of the liquid puddle to the outside of the liquid puddle; and a coating control unit configured to control, after the control by the second dilution control unit, the rotating/holding unit to rotate the substrate at a rotation speed higher than the first rotation speed to allow the processing liquid to be diffused toward the edge of the substrate.

The liquid puddle formation control unit may control, while controlling the rotating/holding unit to rotate the substrate at a second rotation speed equal to or higher than the first rotation speed, the processing liquid supply unit to supply the processing liquid onto the surface of the substrate under a condition that the liquid puddle of the processing liquid is formed at a first region including a rotation center of the substrate and the processing liquid is suppressed from adhering to a second region at an outer side than the first region, the first dilution control unit may control the diluting liquid supply unit to move the supply position of the diluting liquid from the second region to an edge portion of the first region, and the second dilution control unit may control the diluting liquid supply unit to move the supply position of the diluting liquid from the edge portion of the first region to the second region.

The coating control unit may include a first coating control unit configured to control the rotating/holding unit to rotate the substrate at a third rotation speed which is higher than the first rotation speed and allows a mixed solution of the processing liquid and the diluting liquid to be diffused toward the edge of the substrate; and a second coating control unit configured to control, after the control by the first coating control unit, the rotating/holding unit to rotate the substrate at a fourth rotation speed which is higher than the third rotation speed and allows the processing liquid to be diffused toward the edge of the substrate.

The first coating control unit may control the diluting liquid supply unit to start a supply of the diluting liquid onto a position at the inner side than the edge of the substrate before the supply position of the diluting liquid is moved from the second region to the edge portion of the first region.

The first dilution control unit may control the diluting liquid supply unit to start the supply of the diluting liquid after controlling the rotating/holding unit to set the rotation speed of the substrate to a fifth rotation speed lower than the first rotation speed.

The first dilution control unit may control the rotating/holding unit to rotate the substrate at the fifth rotation speed one or more rounds after controlling the diluting liquid supply unit to start the supply of the diluting liquid and before controlling the diluting liquid supply unit to start a movement of the supply position of the diluting liquid.

The second dilution control unit may control, after controlling the diluting liquid supply unit to move the supply position of the diluting liquid from the edge portion of the first region to the second region, the diluting liquid supply unit to stop the supply of the diluting liquid in a state that the supply position of the diluting liquid is located at the inner side than the edge of the substrate.

The liquid puddle formation control unit may control the processing liquid supply unit to start a supply of the processing liquid onto the surface of the substrate in a state that the surface of the substrate is dried, and the first dilution control unit may control the diluting liquid supply unit to start the supply of the diluting liquid in a state that the second region is dried.

According to the above-described exemplary embodiments, it is possible to provide the coating method and the coating apparatus capable of forming the liquid film on the surface of the substrate with high film thickness uniformity, and a recording medium.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 10 is a flowchart illustrating a sequence of a second dilution processing;

DETAILED DESCRIPTION

Figure 1:
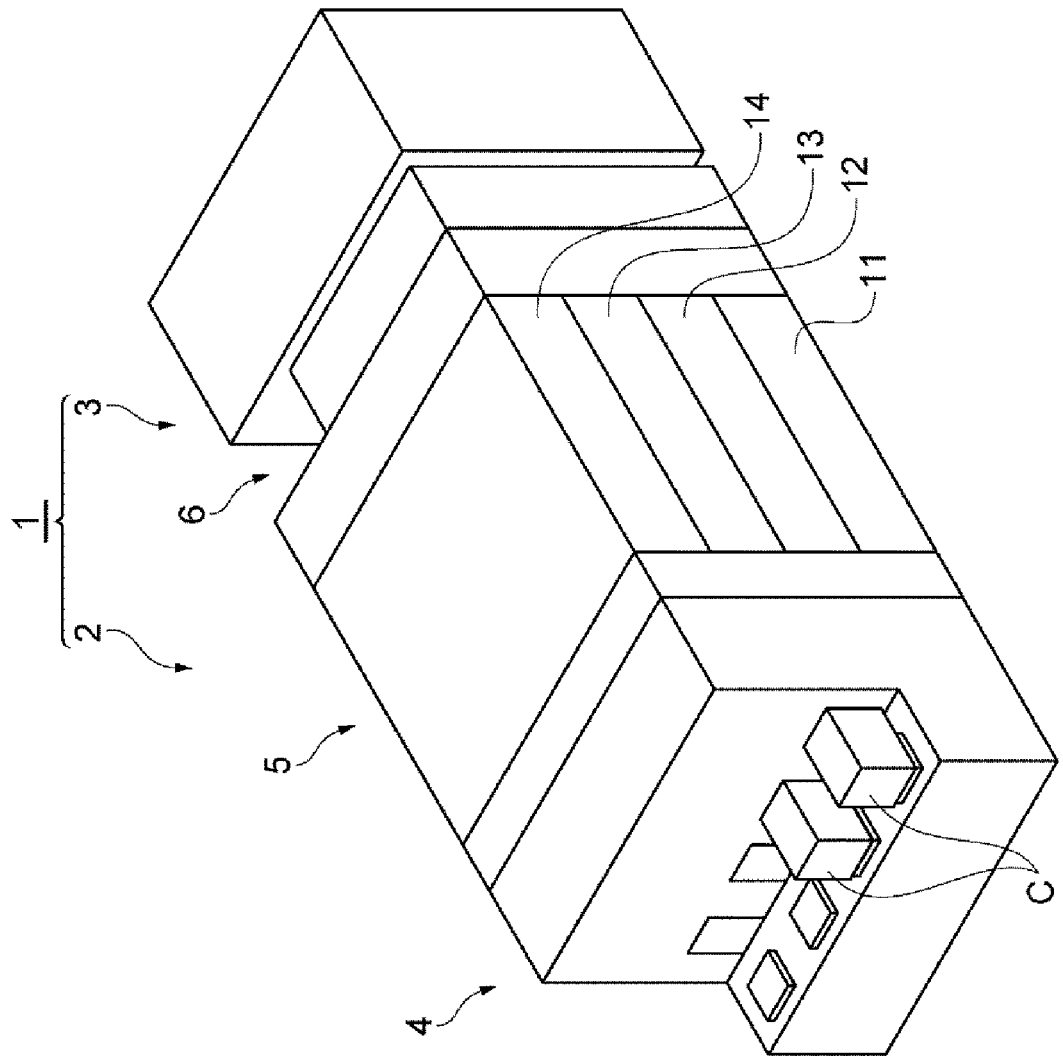
FIG. 1 is a perspective view illustrating a schematic configuration of a substrate liquid processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

[Substrate Processing System]

A substrate processing system 1 is a system configured to perform formation of a photosensitive film on a substrate, exposure of the corresponding photosensitive film and development of the corresponding photosensitive film. The substrate as a processing target object is, for example, a semiconductor wafer W. The photosensitive film is, by way of non-limiting example, a resist film. The substrate processing system 1 includes a coating and developing apparatus 2 and an exposure apparatus 3. The exposure apparatus 3 is configured to perform an exposure processing of the resist film (photosensitive film) formed on the wafer W (substrate). To elaborate, the exposure apparatus 3 irradiates an energy beam to an exposure target portion of the resist film by an immersion exposure method or the like. The coating and developing apparatus 2 is configured to perform a processing of forming the resist film on a surface of the wafer W (substrate) prior to the exposure processing by the exposure apparatus 3, and then, perform a developing processing on the resist film after the exposure processing.

[Coating Apparatus]

Figure 2:
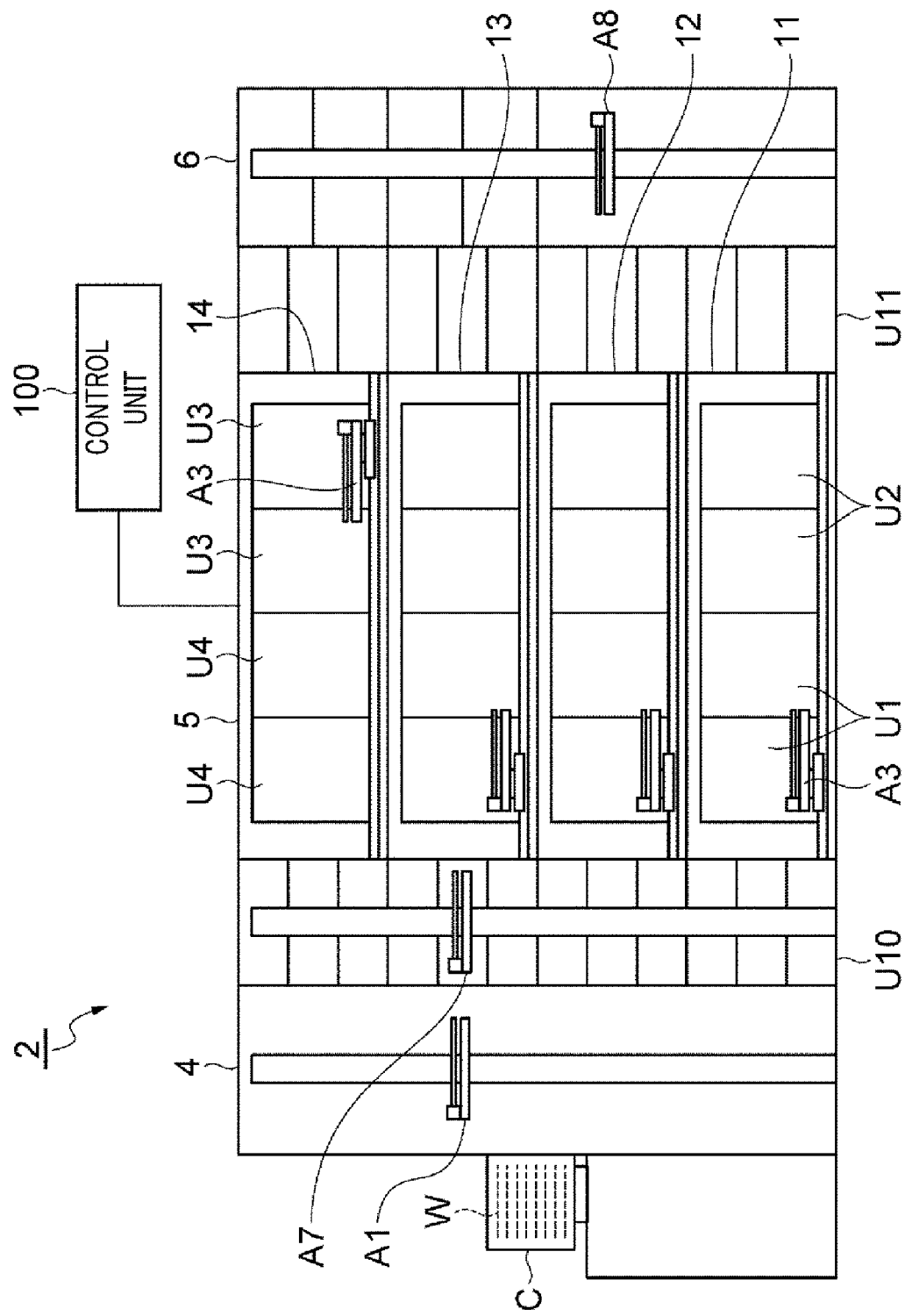
FIG. 2 is a cross sectional view illustrating a schematic configuration of a coating and developing apparatus.

Below, a configuration of the coating and developing apparatus 2 as an example of a coating apparatus will be explained. As depicted in FIG. 1 and FIG. 2, the coating and developing apparatus 2 is equipped with a carrier block 4, a processing block 5, an interface block 6 and a control unit 100.

The carrier block 4 is configured to carry a wafer W into/from the coating and developing apparatus 2. For example, the carrier block 4 is configured to support a plurality of carriers C for wafers W and incorporates therein a delivery arm A1. Each carrier C accommodates therein, for example, a multiple number of circular wafers W. The delivery arm A1 is configured to take out a wafer W from the carrier C, hand the wafer W over to the processing block 5, receive the wafer W from the processing block 5 and return the wafer W back into the carrier C.

The processing block 5 includes multiple processing modules 11, 12, 13 and 14. Each of the processing modules 11, 12 and 13 incorporates coating units U1, heat treatment units U2 and a transfer arm A3 configured to transfer the wafer W into these units.

The processing module 11 is configured to form a bottom film on the surface of the wafer W by the coating unit U1 and the heat treatment unit U2. The coating unit U1 of the processing module 11 is configured to coat a processing liquid for forming the bottom film on the wafer W. The heat treatment unit U2 of the processing module 11 is configured to perform various kinds of heat treatments required to form the bottom film.

The processing module 12 is configured to form a resist film on the bottom film by the coating unit U1 and the heat treatment unit U2. The coating unit U1 of the processing module 12 is configured to coat a processing liquid for forming the resist film on the bottom film. The heat treatment unit U2 of the processing module 12 is configured to perform various kinds of heat treatments required to form the resist film.

The processing module 13 is configured to form a top film on the resist film by the coating unit U1 and the heat treatment unit U2. The coating unit U1 of the processing module 13 is configured to coat a liquid for forming the top film on the resist film. The heat treatment unit U2 of the processing module 13 is configured to perform various kinds of heat treatments required to form the top film.

The processing module 14 incorporates therein developing units U3, heat treatment units U4, and a transfer arm A3 configured to transfer the wafer W into these units.

The processing module 14 is configured to perform a developing processing of the exposed resist film by the developing unit U3 and the heat treatment unit U4. The developing unit U3 is configured to perform the developing processing of the resist film by coating a developing liquid on the surface of the exposed wafer W and washing it with a rinse liquid. The heat treatment unit U4 is configured to perform various kinds of heat treatments required for the developing processing. Specific examples of these heat treatments include a heat treatment (PEB: Post Exposure Bake) performed before the developing processing, a heat treatment (PB: Post Bake) performed after the developing processing, and so forth.

Within the processing block 5, a shelf unit U10 is provided at a side of the carrier block 4. The shelf unit U10 is partitioned into a multiple number of cells arranged in the vertical direction. An elevation arm A7 is provided in the vicinity of the shelf unit U10. The elevation arm A7 is configured to move the wafer W up and down among the cells of the shelf unit U10.

Within the processing block 5, a shelf unit U11 is provided at a side of the interface block 6. The shelf unit U11 is partitioned into multiple cells which are arranged in the vertical direction.

The interface block 6 is configured to deliver the wafer W into/from the exposure apparatus 3. By way of example, the interface block 6 incorporates a delivery arm A8 and is connected to the exposure apparatus 3. The delivery arm A8 is configured to deliver the wafer W placed in the shelf unit U11 to the exposure apparatus 3, and receives the wafer W from the exposure apparatus 3 and returns the received wafer W back into the shelf unit U11.

The control unit 100 controls the coating and developing apparatus 2 to perform a coating and developing processing according to the following sequence, for example. First, the control unit 100 controls the delivery arm A1 to transfer the wafer W within the carrier C to the shelf unit U10, and controls the elevation arm A7 to place this wafer W in the cell for the processing module 11.

Then, the control unit 100 controls the transfer arm A3 to transfer the wafer W of the shelf unit U10 into the coating unit U1 and the heat treatment unit U2 within the processing module 11, and controls the coating unit U1 and the heat treatment unit U2 to form the bottom film on the surface of the wafer W. Thereafter, the control unit 100 controls the transfer arm A3 to return the wafer W having the bottom film formed thereon back into the shelf unit U10, and then controls the elevation arm A7 to place this wafer W in the cell for the processing module 12.

Subsequently, the control unit 100 controls the transfer arm A3 to transfer the wafer W of the shelf unit U10 into the coating unit U1 and the heat treatment unit U2 within the processing module 12, and controls the coating unit U1 and the heat treatment unit U2 to form the resist film on the bottom film of the wafer W. Thereafter, the control unit 100 controls the transfer arm A3 to return the wafer W back into the shelf unit U10, and controls the elevation arm A7 to place this wafer W in the cell for the processing module 13.

Afterwards, the control unit 100 controls the transfer arm A3 to transfer the wafer W of the shelf unit U10 to the respective units within the processing module 13 and controls the coating unit U1 and the heat treatment unit U2 to form the top film on the resist film of the wafer W. Then, the control unit 100 controls the transfer arm A3 to transfer the wafer W to the shelf unit U11.

Thereafter, the control unit 100 controls the delivery arm A8 to deliver the wafer W of the shelf unit U11 to the exposure apparatus 3. Then, the control unit 100 controls the delivery arm A8 to receive from the exposure apparatus 3 the wafer W on which the exposure processing is already performed and return the received wafer W in the cell within the shield unit U11 for the processing module 14.

Thereafter, the control unit 100 controls the transfer arm A3 to transfer the wafer W of the shelf unit U11 into the respective units within the processing module 14, and controls the developing unit U3 and the heat treatment unit U4 to perform the developing processing on the resist film of the wafer W. Then, the control unit 100 controls the transfer arm A3 to return the wafer W to the shelf unit U10, and controls the elevation arm A7 and the delivery arm A1 to return this wafer W back into the carrier C. Then, the coating and developing processing is ended.

A specific configuration of the coating apparatus is not limited to the above-described configuration of the coating and developing apparatus 2. The coating apparatus may be implemented by any of various types of apparatuses as long as it is equipped with the coating unit U1 and the control unit 100 configured to control this coating unit U1.

[Coating Unit]

Figure 3:
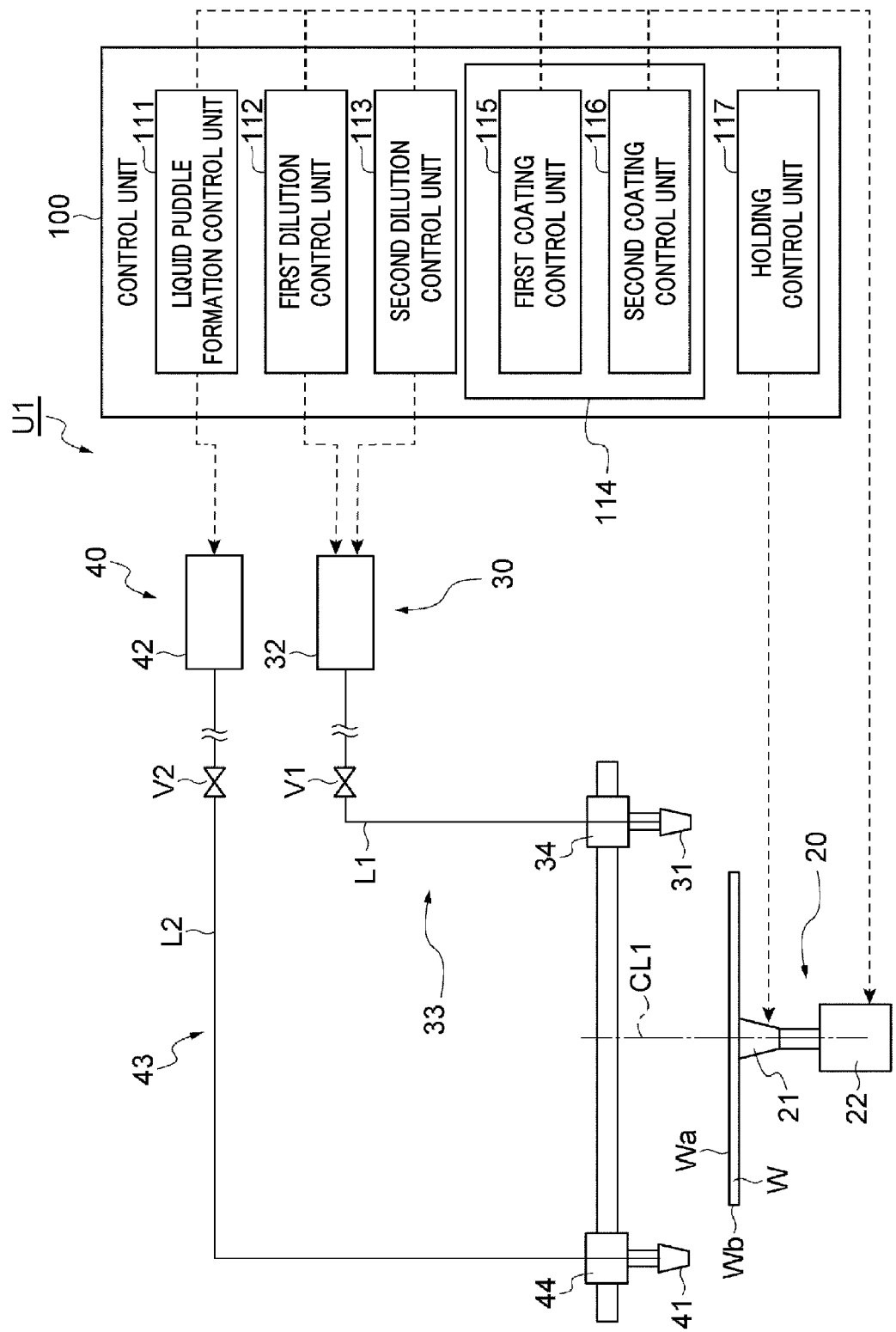
FIG. 3 is a diagram illustrating a schematic configuration of a coating unit.

Now, a configuration of the coating unit U1 of the processing module 12 will be elaborated. The coating unit U1 is configured to supply a processing liquid for the formation of the resist film (hereinafter, referred to as "resist liquid") onto the surface of the wafer W to form a liquid film of a resist liquid on the surface of the wafer W. As depicted in FIG. 3, the coating unit U1 includes a rotating/holding unit 20, a processing liquid supply unit 30 and a diluting liquid supply unit 40.

The rotating/holding unit 20 is configured to hold and rotate the wafer W. By way of example, the rotating/holding unit 20 is equipped with a holding unit 21 and a rotational driving unit 22. The holding unit 21 is configured to support a central portion of the wafer W placed thereon, whose surface Wa faces upwards, and hold the corresponding wafer W by, for example, vacuum attraction. The rotational driving unit 22 is configured to rotate the holding unit 21 around a vertical rotation center CL1 by using, for example, an electric motor as a power source. Thus, the wafer W is also rotated.

The processing liquid supply unit 30 is configured to supply the resist liquid onto the surface Wa of the wafer W. By way of example, the processing liquid supply unit 30 is equipped with a nozzle 31, a liquid source 32, a liquid feed unit 33, and a nozzle transfer unit 34. The nozzle 31 is configured to discharge the resist liquid toward the surface Wa of the wafer W (downwards). The liquid source 32 stores the resist liquid therein and force-feeds the corresponding resist liquid toward the nozzle 31. The resist liquid has viscosity ranging from 1000 cP to 7000 cP. The viscosity of the resist liquid may be in the range from 3000 cP to 5000 cP. The liquid feed unit 33 is configured to introduce the resist liquid from the liquid source 32 to the nozzle 31. By way of example, the liquid feed unit 33 is equipped with a liquid feed line L1 and a valve V1. The liquid feed line L1 connects the liquid source 32 with the nozzle 31. The valve V1 may be implemented by, for example, an air operation valve and is configured to open/close a flow path within the liquid feed line L1. The nozzle transfer unit 34 is configured to transfer the nozzle 31 in the horizontal direction by using an electric motor or the like as a power source.

The diluting liquid supply unit 40 is configured to supply a diluting liquid onto the surface Wa of the wafer W. By way of non-limiting example, the diluting liquid supply unit 40 is equipped with a nozzle 41, a liquid source 42, a liquid feed unit 43 and a nozzle transfer unit 44. The nozzle 41 is configured to discharge the diluting liquid toward the surface Wa of the wafer W (downwards). The liquid source 42 stores the diluting liquid therein and force-feeds the diluting liquid to the nozzle 41. The diluting liquid has lower viscosity than the resist liquid, and is capable of dissolving the resist liquid. As a specific example, the diluting liquid may be an organic solvent such as thinner. The liquid feed unit 43 is configured to introduce the diluting liquid from the liquid source 42 to the nozzle 41. By way of example, the liquid feed unit 43 is equipped with a liquid feed line L2 and a valve V2. The liquid feed line L2 connects the liquid source 42 with the nozzle 41. The valve V2 is implemented by, for example, an air operation valve and configured to open/close a flow path within the liquid feed line L2. The nozzle transfer unit 44 is configured to transfer the nozzle 41 in the horizontal direction by using an electric motor or the like as a power source.

The coating unit U1 having the above-described configuration is controlled by the control unit 100. The control unit 100 controls the processing liquid supply unit 30 to supply the resist liquid onto the surface Wa of the wafer W under a condition that a liquid puddle of the resist liquid is formed at a central portion of the surface Wa of the wafer W; controls, while controlling the rotating/holding unit 20 to rotate the wafer W at a first rotation speed set to allow the liquid puddle to stay at an inner side of the wafer W than an edge Wb thereof, the diluting liquid supply unit 40 to supply the diluting liquid onto the surface Wa of the wafer W and move a diluting liquid supply position from an outside of the liquid puddle to an edge portion of the liquid puddle; controls, after the diluting liquid supply position is moved from the outside of the liquid puddle to the edge portion of the liquid puddle, while controlling the rotating/holding unit 20 to continue to rotate the wafer W at the first rotation speed, the diluting liquid supply unit 40 to move the diluting liquid supply position from the edge portion of the liquid puddle to the outside of the liquid puddle; and controls, after the diluting liquid supply position is moved from the edge portion of the liquid puddle to the outside of the liquid puddle, the rotating/holding unit 20 to rotate the substrate at a rotation speed higher than the first rotation speed to allow the resist liquid to be diffused toward the edge Wb of the wafer W. Here, the edge portion of the liquid puddle refers to a ring-shaped portion within the liquid puddle which is positioned near an edge of the liquid puddle.

By way of example, the control unit 100 has, as functional components (hereinafter, referred to as "functional modules"), a liquid puddle formation control unit 111, a first dilution control unit 112, a second dilution control unit 113, a coating control unit 114 and a holding control unit 117.

The liquid puddle formation control unit 111 controls the processing liquid supply unit 30 to supply the resist liquid onto the surface Wa of the wafer W under the condition that the liquid puddle of the resist liquid is formed at the central portion of the surface Wa of the wafer W. By way of example, while controlling the rotating/holding unit 20 to rotate the wafer W at a second rotation speed equal to or higher than the first rotation speed, the liquid puddle formation control unit 111 controls the processing liquid supply unit 30 to supply the resist liquid onto the surface Wa of the wafer W under a condition that the liquid puddle of the resist liquid is formed at a first region including the rotation center CL1 of the wafer W and the resist liquid is suppressed from adhering to a second region at an outer side than the first region.

The liquid puddle formation control unit 111 may control the processing liquid supply unit 30 to start the supply of the resist liquid onto the surface Wa of the wafer W in the state that the surface Wa of the wafer W is dried.

The first dilution control unit 112 controls, while controlling the rotating/holding unit 20 to rotate the wafer W at the first rotation speed, the diluting liquid supply unit 40 to supply the diluting liquid onto the surface Wa of the wafer W and to move the diluting liquid supply position from the outside of the liquid puddle to the edge portion of the liquid puddle. By way of example, the first dilution control unit 112 controls the diluting liquid supply unit 40 to move the diluting liquid supply position from the second region to an edge portion of the first region.

The first dilution control unit 112 may control the diluting liquid supply unit 40 to start a supply of the diluting liquid onto an inner position than the edge Wb of the wafer W prior to moving the diluting liquid supply position from the second region to the edge portion of the first region. In this case, the first dilution control unit 112 may control the diluting liquid supply unit 40 to start the supply of the diluting liquid after controlling rotating/holding unit 20 to rotate the wafer W at a fifth rotation speed lower than the first rotation speed. Here, the fifth rotation speed may be zero. That is, the first dilution control unit 112 may control the diluting liquid supply unit 40 to start the supply of the diluting liquid after stopping the rotation of the wafer W. After controlling the diluting liquid supply unit 40 to start the supply of the diluting liquid and before controlling the diluting liquid supply unit 40 to start the movement of the diluting liquid supply position, the first dilution control unit 112 may control the rotating/holding unit 20 to keep on rotating the wafer W one or more rounds at the fifth rotation speed.

The first dilution control unit 112 may control the diluting liquid supply unit 40 to start the supply of the diluting liquid in the state that the second region is dried.

The second dilution control unit 113 controls, after the control by the first dilution control unit 112, the diluting liquid supply unit 40 to move the diluting liquid supply position from the edge portion of the liquid puddle to the outside of the liquid puddle, while controlling the rotating/holding unit 20 to keep on rotating the wafer W at the first rotation speed. By way of example, the second dilution control unit 113 controls the diluting liquid supply unit 40 to move the diluting liquid supply position from the edge portion of the first region to the second region.

After controlling the diluting liquid supply unit 40 to move the diluting liquid supply position from the edge portion of the first region to the second region, the second dilution control unit 113 may control the diluting liquid supply unit 40 to stop the supply of the diluting liquid in the state that the diluting liquid supply position is located at the inner position than the edge Wb of the wafer W.

The coating control unit 114 controls, after the control by the second dilution control unit 113, the rotating/holding unit 20 to rotate the substrate at a rotation speed higher than the first rotation speed to allow the resist liquid to be diffused toward the edge Wb of the wafer W.

For example, the coating control unit 114 includes a first coating control unit 115 and a second coating control unit 116. The first coating control unit 115 controls, after the control by the second dilution control unit 113, the rotating/holding unit 20 to rotate the wafer W at a third rotation speed, which is higher than the first rotation speed and allows a mixed solution of the resist liquid and the diluting liquid to be diffused toward the edge Wb of the wafer W. The second coating control unit 116 controls, after the control by the first coating control unit 115, the rotating/holding unit 20 to rotate the wafer W at a fourth rotation speed, which is higher than the third rotation speed and allows the resist liquid to be diffused toward the edge Wb of the wafer W.

The holding control unit 117 controls the rotating/holding unit 20 to hold the wafer W by the holding unit 21 after the wafer W is carried into the coating unit U1 by the transfer arm A3, and controls the rotating/holding unit 20 to release the holding of the corresponding wafer W by the holding unit 21 before the wafer W is carried out from the coating unit U1 by the transfer arm A3.

Figure 4:
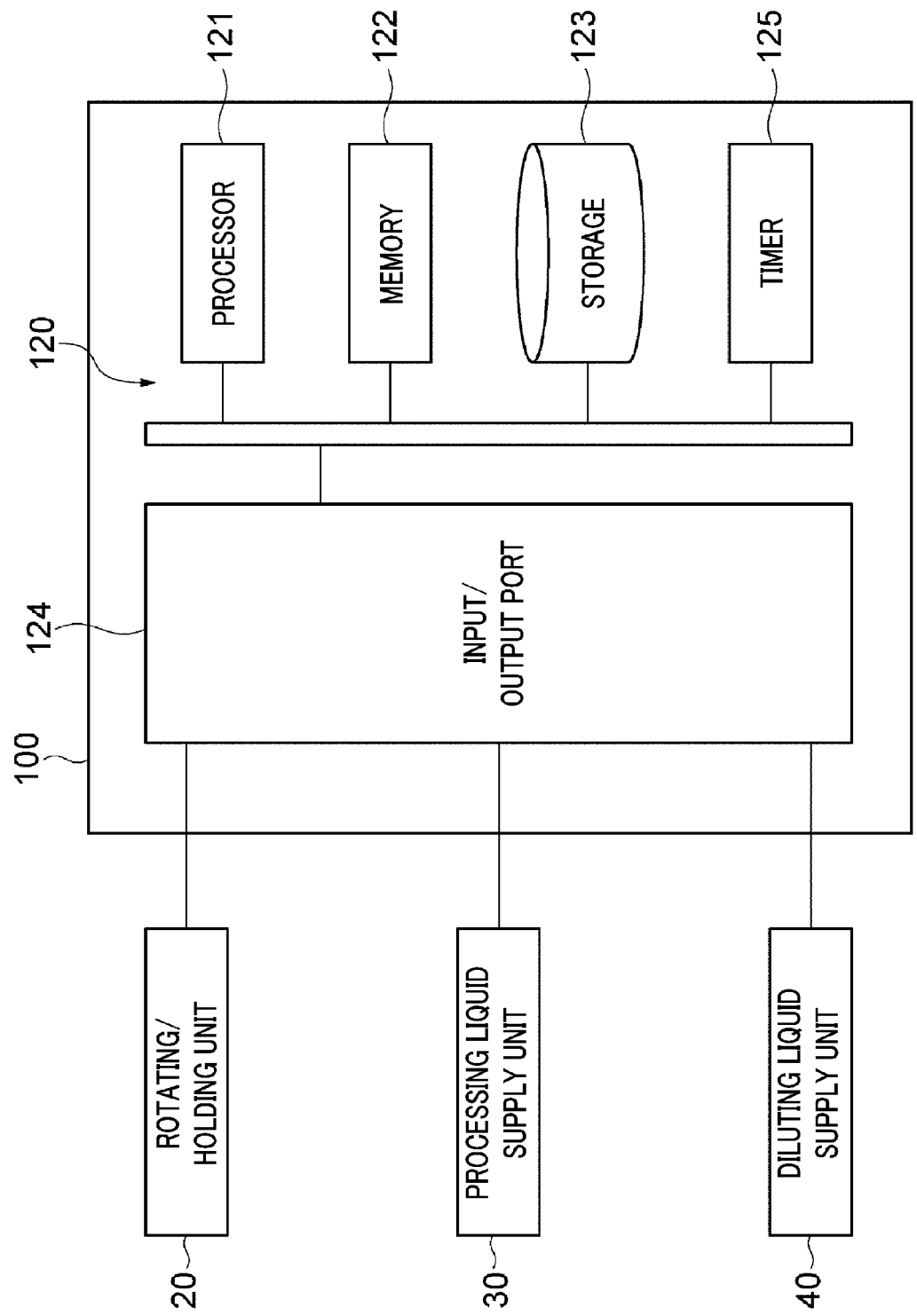
FIG. 4 is a block diagram showing a hardware configuration of a control unit.

The control unit 100 is composed of one or more control computers. By way of example, the control unit 100 has a circuit 120 illustrated in FIG. 4. The circuit 120 is equipped with one or more processors 121, a memory 122, a storage 123, an input/output port 124 and a timer 125.

The storage 123 has a computer-readable recording medium such as, but not limited to, a hard disk. The recording medium stores therein programs that cause the coating unit U1 to carry out a coating sequence to be described later. The recording medium may be a portable medium such as, by way of example, a nonvolatile semiconductor memory, a magnetic disk or an optical disk. The memory 122 temporarily stores thereon the programs loaded from the recording medium of the storage 123 and an operation result by the processor 121. The processor 121 constitutes the aforementioned individual functional modules by executing the programs in cooperation with the memory 122. The input/output port 124 is configured to perform an input and an output of an electric signal between the rotating/holding unit 20, the processing liquid supply unit 30 and the diluting liquid supply unit 40 in response to an instruction from the processor 121. The timer 125 is configured to measure an elapsed time by, for example, counting a reference pulse of a preset cycle.

Further, the hardware configuration of the control unit 100 is not limited to constituting the individual functional modules by the programs. For example, each functional module of the control unit 100 may be implemented by a dedicated logical circuit or an ASIC (Application Specific Integrated Circuit) which is an integration of the logical circuits.

[Coating Sequence]

Now, as an example of a coating method, a coating sequence performed as the control unit 100 controls the coating unit U1 will be explained. This coating sequence includes supplying the resist liquid onto the surface Wa of the wafer W under the condition that the liquid puddle of the resist liquid is formed at the central portion of the surface Wa of the wafer W; supplying the diluting liquid onto the surface Wa of the wafer W and moving the diluting liquid supply position from the outside of the liquid puddle to the edge portion of the liquid puddle, while rotating the wafer W at the first rotation speed set to allow the liquid puddle to stay at the inner side than the edge Wb of the wafer W; after moving the diluting liquid supply position from the outside of the liquid puddle to the edge portion of the liquid puddle, moving the diluting liquid supply position from the edge portion of the liquid puddle to the outside thereof while continuing to rotate the wafer W at the first rotation speed; after moving the diluting liquid supply position from the edge portion of the liquid puddle to the outside thereof, rotating the wafer W at the rotation speed higher than the first rotation speed to allow the resist liquid to be diffused toward the edge Wb of the wafer W.

The forming of the liquid puddle of the resist liquid at the central portion of the surface Wa of the wafer W may include, while rotating the wafer W at the second rotation speed equal to or higher than the first rotation speed, supplying the resist liquid onto the surface Wa of the wafer W under the condition that the liquid puddle of the resist liquid is formed at the first region including the rotation center of the wafer W and the resist liquid is suppressed from adhering to the second region at the outer side than the first region. The moving of the diluting liquid supply position from the outside of the liquid puddle to the edge portion of the liquid puddle may include moving the diluting liquid supply position from the second region to the edge portion of the first region. The moving of the diluting liquid supply position from the edge portion of the liquid puddle to the outside of the liquid puddle may include moving the diluting liquid supply position from the edge portion of the first region to the second region.

The rotating of the wafer W at the rotation speed higher than the first rotation speed after moving the diluting liquid supply position from the edge portion of the liquid puddle to the outside of the liquid puddle may include rotating the wafer W at the third rotation speed which is higher than the first rotation speed and allows the mixed solution of the resist liquid and the diluting liquid to be diffused toward the edge Wb of the wafer W; and rotating the wafer W, after rotating the wafer W at the third rotation speed, at the fourth rotation speed which is higher than the third rotation speed and allows the resist liquid to be diffused toward the edge Wb of the wafer W.

The supply of the diluting liquid onto a position at the inner side than the edge Wb of the wafer W may be begun before moving the diluting liquid supply position from the second region to the edge portion of the first region. In this case, the supply of the diluting liquid may be begun after the rotation speed of the wafer W is set to the fifth rotation speed lower than the first rotation speed, or the wafer W may be continued to be rotated at the fifth rotation speed one or more rounds before the moving of the diluting liquid supply position is started and after the supply of the diluting liquid is begun.

After moving the diluting liquid supply position from the edge portion of the first region to the second region, the supply of the diluting liquid may be stopped in the state that the diluting liquid supply position is located at the inner side than the edge Wb of the wafer W.

The supply of the resist liquid onto the surface Wa of the wafer W may be begun in the state that the surface of the wafer W is dried, and the supply of the diluting liquid may be begun in the state that the second region is dried.

Figure 5:
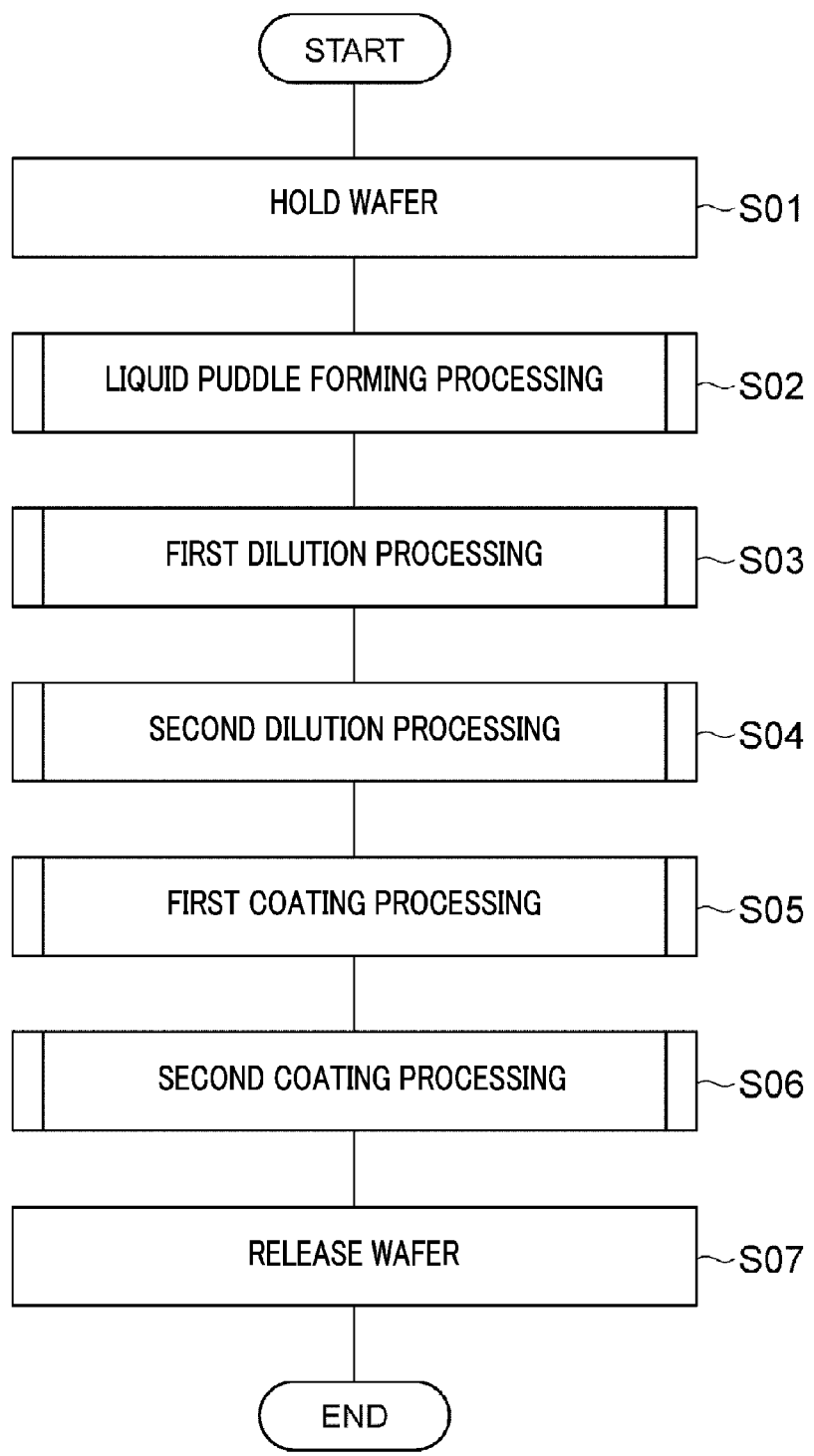
FIG. 5 is a flowchart illustrating a coating sequence.

Now, a specific example of a control sequence over the coating unit U1 by the control unit 100 will be described. As depicted in FIG. 5, the control unit 100 first performs a process S01. In the process S01, the holding control unit 117 controls the rotating/holding unit 20 to hold the wafer W, which is carried into the coating unit U1 by the transfer arm A3, by the holding unit 21.

Then, the control unit 100 performs a process S02. In the process S02, the liquid puddle formation control unit 111 performs a liquid puddle formation control. The liquid puddle formation control includes controlling, while controlling the rotating/holding unit 20 to rotate the wafer W at the second rotation speed, the processing liquid supply unit 30 to supply the resist liquid onto the surface Wa of the wafer W under the condition that the liquid puddle of the resist liquid is formed at the first region including the rotation center CL1 of the wafer W and the resist liquid is suppressed from adhering to the second region at the outer side than the first region. Details of this liquid puddle formation control will be discussed later.

Thereafter, the control unit 100 performs a process S03. In the process S03, the first dilution control unit 112 performs a first dilution control. The first dilution control includes, while controlling the rotating/holding unit 20 to rotate the wafer W at the first rotation speed lower than the second rotation speed, controlling the diluting liquid supply unit 40 to supply the diluting liquid onto the surface Wa of the wafer W and move the diluting liquid supply position from the second region to the edge portion of the first region. Details of the first dilution control will be explained later.

Subsequently, the control unit 100 performs a process S04. In the process S04, the second dilution control unit 113 performs a second dilution control. The second dilution control includes, while controlling the rotating/holding unit 20 to keep on rotating the wafer W at the first rotation speed, controlling the diluting liquid supply unit 40 to move the diluting liquid supply position from the edge portion of the first region to the second region. Details of the second dilution control will be described later.

Next, the control unit 100 performs a process S05. In the process S05, the first coating control unit 115 performs a first coating control. The first coating control includes controlling the rotating/holding unit 20 to rotate the wafer W at the third rotation speed which is higher than the first rotation speed and allows the mixed solution of the resist liquid and the diluting liquid to be diffused toward the edge Wb of the wafer W. Details of the first coating control will be elaborated later.

Afterwards, the control unit 100 performs a process S06. In the process S06, the second coating control unit 116 performs a second coating control. The second coating control includes controlling the rotating/holding unit 20 to rotate the wafer W at the fourth rotation speed which is higher than the third rotation speed and allows the resist liquid to be diffused toward the edge Wb of the wafer W. Details of the second coating control will be explained later.

Then, the control unit 100 performs a process S07. In the process S07, the holding control unit 117 controls the rotating/holding unit 20 to release the holding of the wafer W by the holding unit 21. Thereafter, the wafer W is carried out of the coating unit U1 by the transfer arm A3.

(Liquid Puddle Formation Control)

Figure 6:
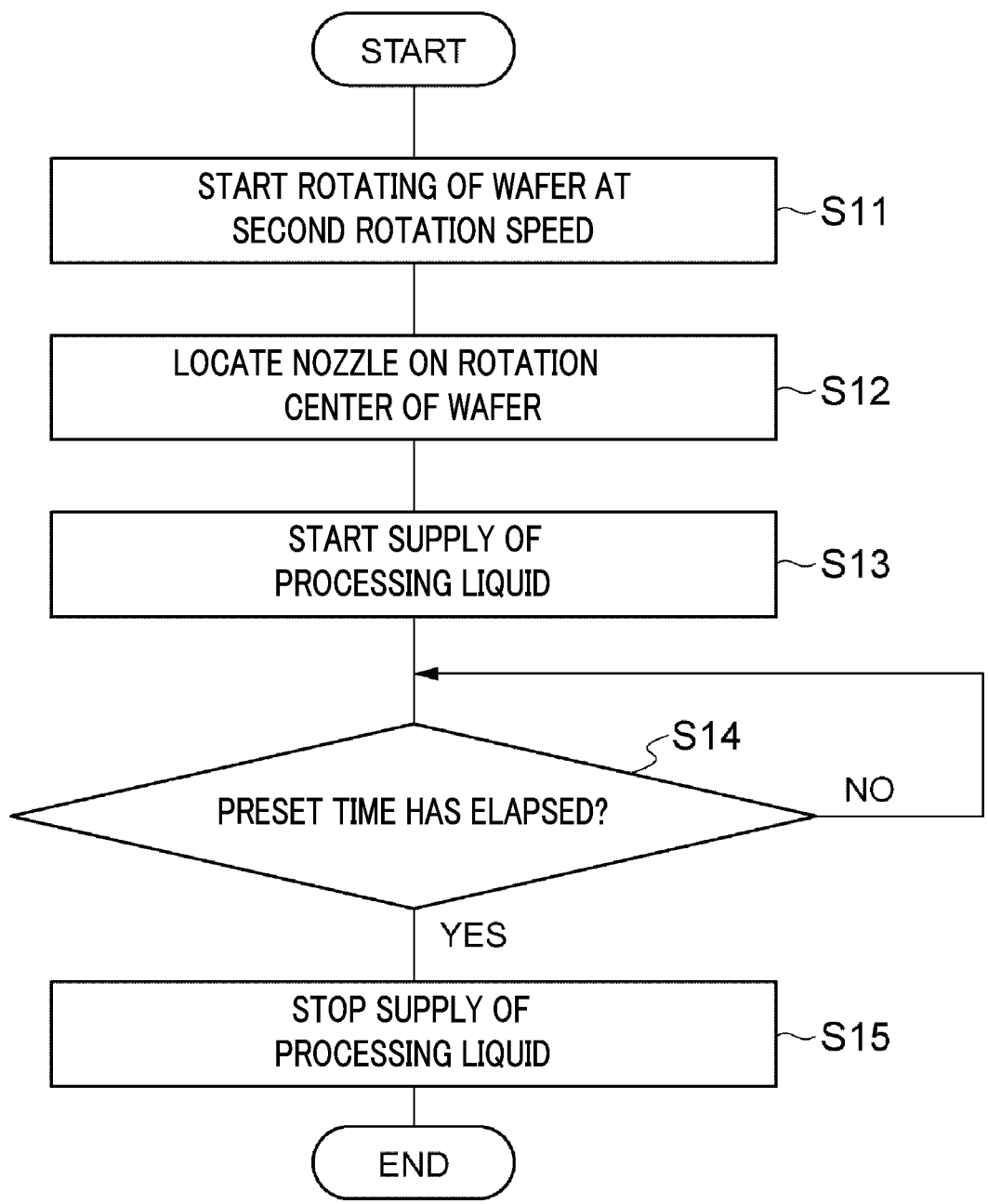
FIG. 6 is a flowchart for describing a sequence of a liquid puddle forming processing.
Figure 7A:
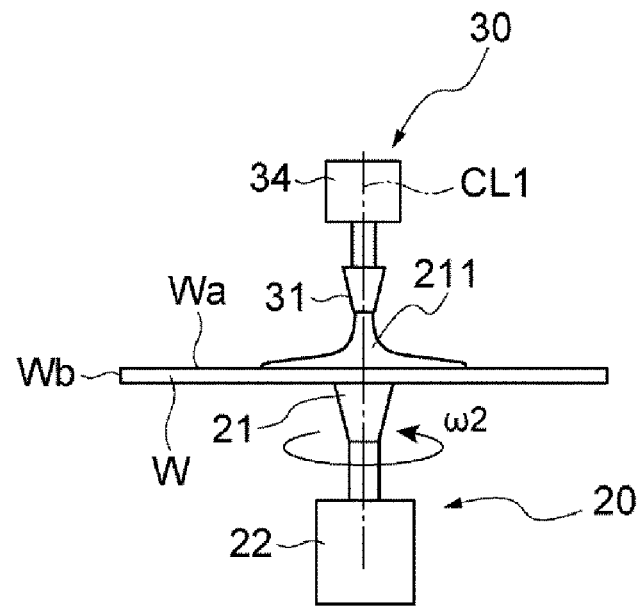
FIG. 7A and FIG. 7B are schematic diagrams illustrating wafer states during the liquid puddle forming processing.

Now, the details of the liquid puddle formation control in the process S02 will be explained. As depicted in FIG. 6, the control unit 100 first performs a process S11. In the process S11, the liquid puddle formation control unit 111 controls the rotating/holding unit 20 to start rotating the wafer W at a second rotation speed $\omega 2$ (see FIG. 7A) by the rotational driving unit 22.

The second rotation speed $\omega 2$ is set not to generate a centrifugal force which causes the resist liquid supplied on the surface Wa of the wafer W to be diffused toward the edge Wb. The second rotation speed $\omega 2$ is set to be in the range from, by way of non-limiting example, 50 rpm to 250 rpm, or may be in the range from 100 rpm to 200 rpm. The liquid puddle formation control unit 111 may control the rotating/holding unit 20 to change the rotation speed of the wafer W gradually from a stop state up to the second rotation speed $\omega 2$. Here, the changing of the rotation speed gradually includes changing it in stages, the same as in the following.

Then, the control unit 100 performs a process S12. In the process S12, the liquid puddle formation control unit 111 controls the processing liquid supply unit 30 to locate the nozzle 31 on the rotation center CL1 of the wafer W by the nozzle transfer unit 34.

Thereafter, the control unit 100 performs a process S13. In the process S13, the liquid puddle formation control unit 111 controls the processing liquid supply unit 30 to start the supply of a resist liquid 211 downwards from the nozzle 31 by opening the valve V1. Accordingly, the resist liquid 211 is supplied onto the rotation center CL1 of the surface Wa (see FIG. 7A).

Next, the control unit 100 performs a process S14. In the process S14, the liquid puddle formation control unit 111 waits for a lapse of a preset time. The preset time is set through previous conditions such that an appropriate liquid puddle is formed.

Afterwards, the control unit 100 performs a process S15. In the process S15, the liquid puddle formation control unit 111 controls the processing liquid supply unit 30 to stop the downward supply of the resist liquid 211 from the nozzle 31 by closing the valve V1.

Figure 7B:
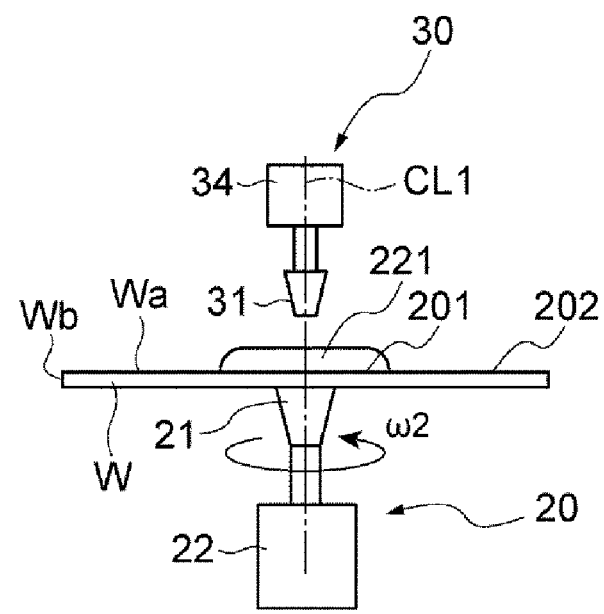

Upon the completion of the liquid puddle formation control through the above-described processes, a liquid puddle 221 of the resist liquid 211 is formed at a first region 201 on the surface Wa including the rotation center CL1 (see FIG. 7B). The resist liquid 211 does not adhere to a second region 202 at an outer side than the first region 201.

Further, the above-described sequence can be appropriately modified as long as the liquid puddle 221 of the resist liquid 211 is formed at the first region 201 including the rotation center CL1 and the resist liquid 211 is suppressed from adhering to the second region 202. By way of example, the locating of the nozzle 31 (process S12) may be performed prior to the starting of the rotating of the wafer W (process S11). Furthermore, in the process S12, the nozzle 31 may be located at a position deviated from the rotation center CL1, and the nozzle 31 may be moved by the nozzle transfer unit 34 during the waiting for the preset time length (process S14).

(First Dilution Control)

Figure 8:
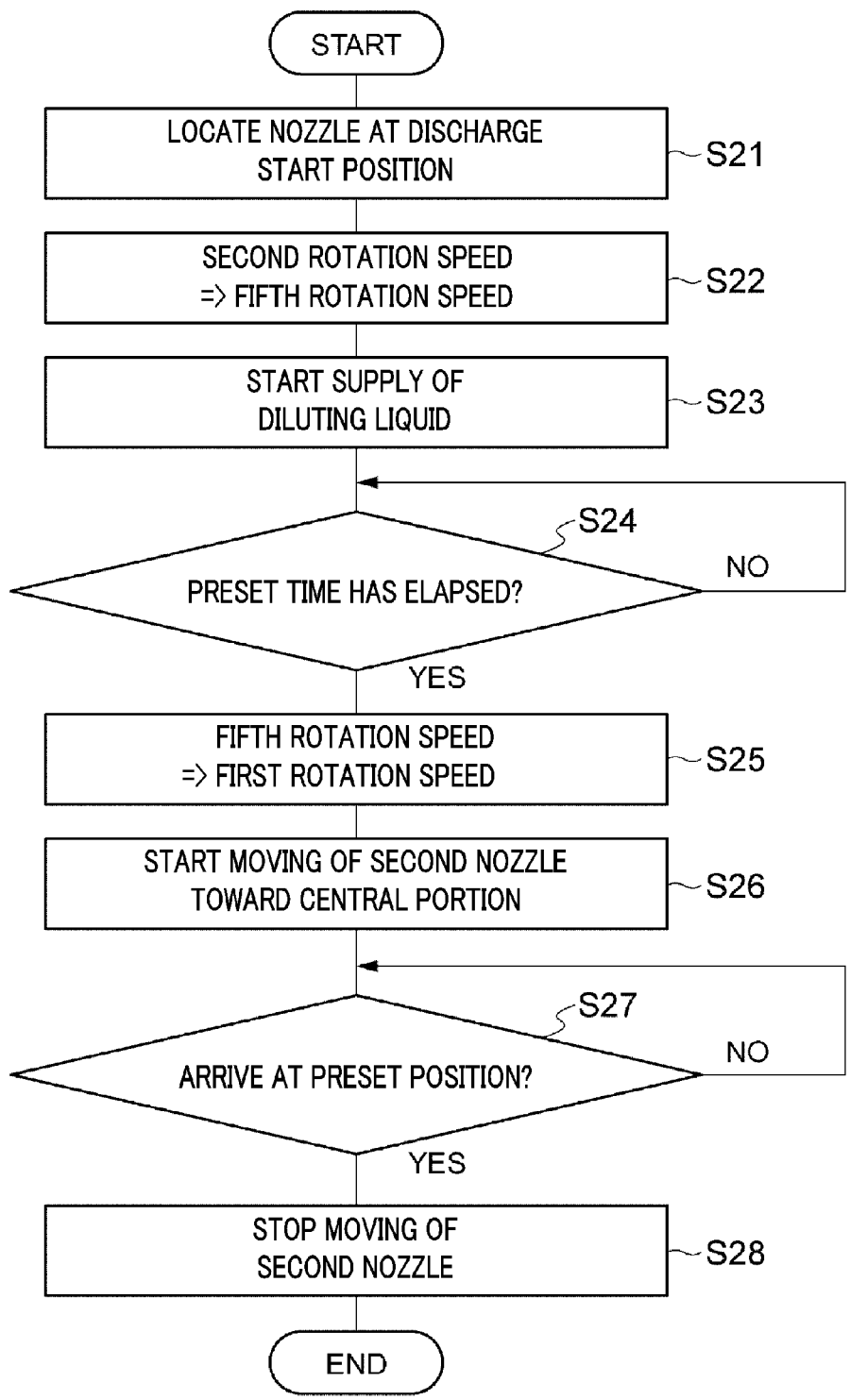
FIG. 8 is a flowchart illustrating a sequence of a first dilution processing.

Now, the details of the first dilution control in the process S03 will be explained. As depicted in FIG. 8, the control unit 100 first performs a process S21. In the process S21, the first dilution control unit 112 controls the diluting liquid supply unit 40 to locate a center of the nozzle 41 at a discharge start position by the nozzle transfer unit 44. The discharge start position is located above a position within the second region 202 at an inner side than the edge Wb of the wafer W.

Figure 9A:
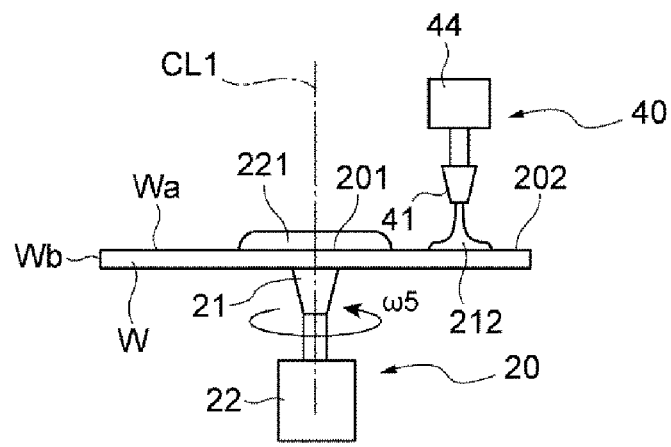
FIG. 9A to FIG. 9C are schematic diagrams illustrating the wafer states during the first dilution processing.

Then, the control unit 100 performs a process S22. In the process S22, the first dilution control unit 112 controls the rotating/holding unit 20 to change the rotation speed of the wafer W from the second rotation speed $\omega 2$ to a fifth rotation speed $\omega 5$ (see FIG. 9A).

The fifth rotation speed is set to be in the range from, by way of non-limiting example, 0 rpm to 40 rpm, or may be in the range from 0 rpm to 20 rpm. That is, the first dilution control unit 112 may control the diluting liquid supply unit 40 to start the supply of the diluting liquid in the state that the rotation of the wafer W is stopped. The first dilution control unit 112 may control the rotating/holding unit 20 to change the rotation speed of the wafer W gradually from the second rotation speed $\omega 2$ to the fifth rotation speed $\omega 5$.

Then, the control unit 100 performs a process S23. In the process S23, the first dilution control unit 112 controls the diluting liquid supply unit 40 to start the supply of a diluting liquid 212 downwards from the nozzle 41 by opening the valve V2. Accordingly, the diluting liquid 212 is supplied onto the position within the second region 202 at the inner side than the edge Wb of the wafer W (see FIG. 9A).

Figure 9B:
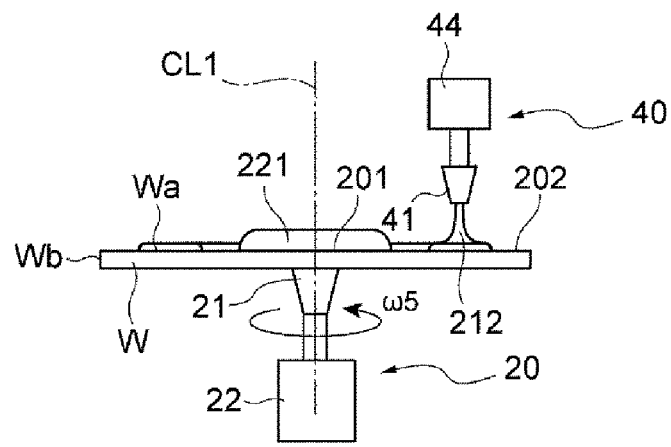

Thereafter, the control unit 100 performs a process S24. In the process S24, the first dilution control unit 112 waits for a lapse of a predetermined time. The predetermined time is set to be equal to or longer than a time taken for the wafer W to be rotated one round at the fifth rotation speed ω5. With the lapse of the predetermined time, the diluting liquid is coated in an annular shape (see FIG. 9B).

Subsequently, the control unit 100 performs a process S25. In the process S25, the first dilution control unit 112 controls the rotating/holding unit 20 to change the rotation speed of the wafer W from the fifth rotation speed ω5 to a first rotation speed ω1 (see FIG. 9C).

The first rotation speed is set to be in the range from 20 rpm to 100 rpm, or may be in the range from 40 rpm to 80 rpm. The first dilution control unit 112 may control the rotating/holding unit 20 to change the rotation speed of the wafer W gradually from the fifth rotation speed ω5 to the first rotation speed ω1.

Next, the control unit 100 performs a process S26. In the process S26, the first dilution control unit 112 controls the diluting liquid supply unit 40 to start the moving of the nozzle 41 toward the rotation center CL1 by the nozzle transfer unit 44.

Figure 9C:
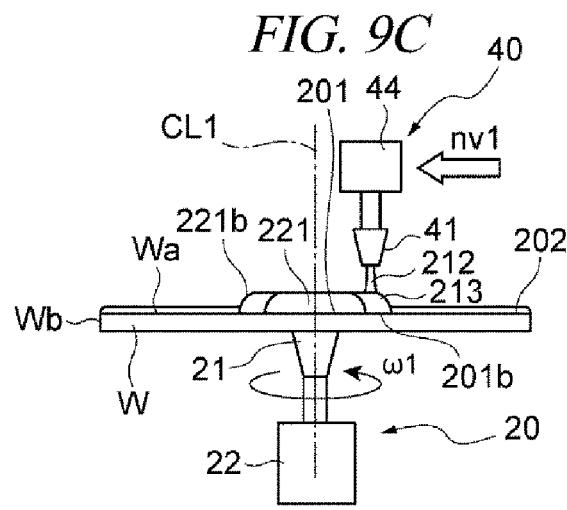

Thereafter, the first dilution control unit 112 controls the diluting liquid supply unit 40 to move the nozzle 41 at a first moving speed nv1 (see FIG. 9C). The first moving speed nv1 is in the range from, for example, 1 mm/s to 20 mm/s, or may be in the range from 5 mm/s to 15 mm/s.

Afterwards, the control unit 100 performs a process S27. In the process S27, the first dilution control unit 112 waits until the center of the nozzle 41 reaches a preset position. This preset position is above an edge portion 201b of the first region 201. Here, the preset position is a position distanced from the rotation center CL1 by 2/3 to 11/12 of a radius of the first region 201, or may be a position distanced from the rotation center CL1 by 3/4 to 6/7 of the corresponding radius.

Then, the control unit 100 performs a process S28. In the process S28, the first dilution control unit 112 controls the diluting liquid supply unit 40 to stop the movement of the nozzle 41 by the nozzle transfer unit 44.

Through the above-described processes, the first dilution control is completed. As the nozzle 41 is moved to the preset position, the edge portion 221b of the liquid puddle 221 is diluted with the diluting liquid 212, and the resist liquid 211 is surrounded by a mixed solution 213 of the resist liquid 211 and the diluting liquid 212 (see FIG. 9C).

Further, the above-described sequence may be appropriately modified as long as the nozzle 41, which is discharging the diluting liquid 212, is moved from the second region 202 to the edge portion of the first region 201. By way of example, the changing of the rotation speed of the wafer W (process S22) may be performed prior to the locating of the nozzle 41 (process S21).

(Second Dilution Control)

Figure 11A:
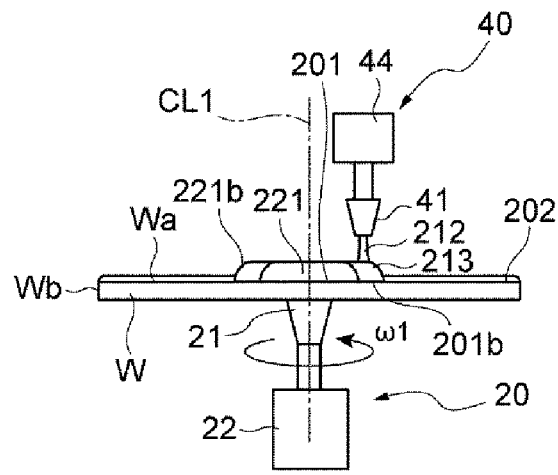
FIG. 11A to FIG. 11C are schematic diagrams illustrating the wafer states during the second dilution processing.

Now, the details of the second dilution control in the process S04 will be explained. As shown in FIG. 10, the control unit 100 first performs a process S31. In the process S31, the second dilution control unit 113 waits until a preset time elapses. Accordingly, the dilution of the edge portion 221b of the liquid puddle 221 is continued (see FIG. 11A). The preset time is set through previous conditions such that the edge portion 221b of the liquid puddle 221 is sufficiently diluted.

Figure 11B:
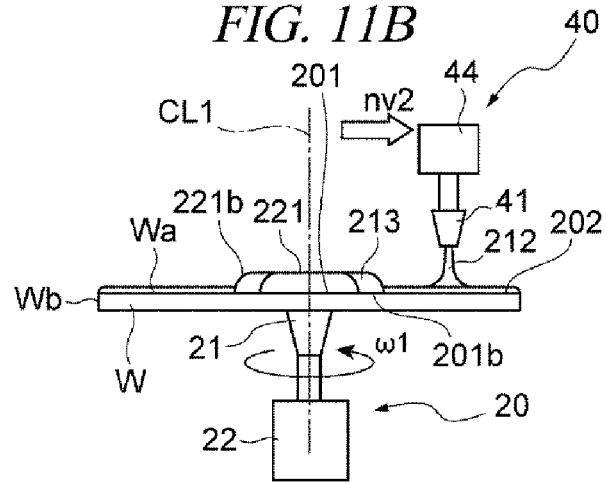
Figure 11C:
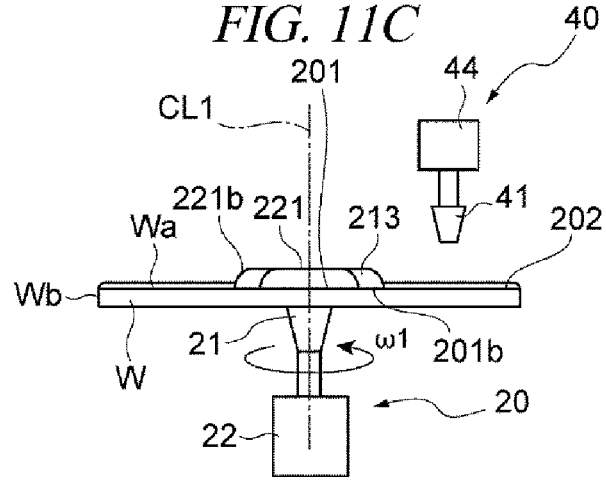

Afterwards, the control unit 100 performs a process S32. In the process S32, the second dilution control unit 113 controls the diluting liquid supply unit 40 to start the moving of the nozzle 41 toward the edge Wb of the wafer W by the nozzle transfer unit 44. Thereafter, the second dilution control unit 113 controls the diluting liquid supply unit 40 to move the nozzle 41 at a second moving speed nv2 (see FIG. 11B). By way of non-limiting example, the second moving speed nv2 is equal to the first moving speed nv1.

Next, the control unit 100 performs a process S33. In the process S33, the second dilution control unit 113 waits until the center of the nozzle 41 reaches a discharge stop position. The discharge stop position is above a position within the second region 202 at the inner side than the edge Wb of the wafer W.

Then, the control unit 100 performs a process S34. In the process S34, the second dilution control unit 113 controls the diluting liquid supply unit 40 to stop the downward supply of the diluting liquid 212 from the nozzle 41 by closing the valve V2. Through these processes, the second dilution control is completed.

(First Coating Control)

Figure 12:
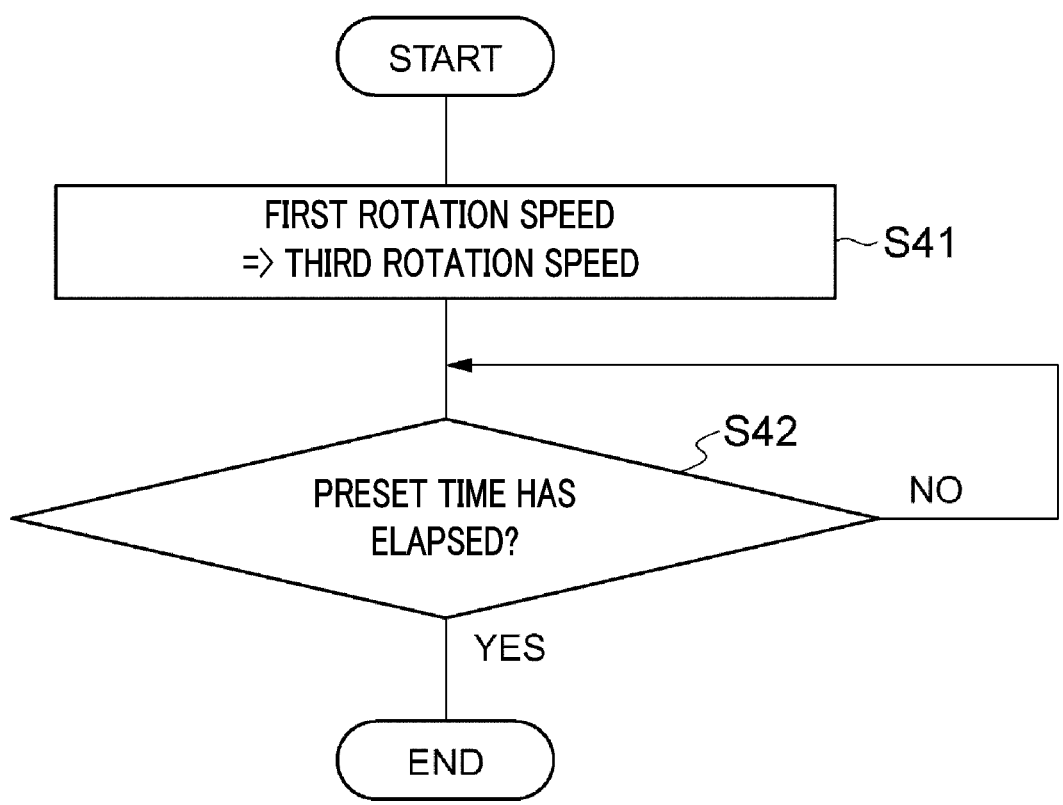
FIG. 12 is a flowchart illustrating a sequence of a first coating processing.
Figure 14A:
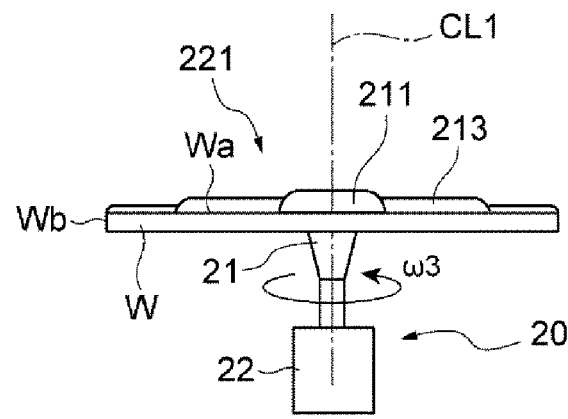
FIG. 14A to FIG. 14C are schematic diagrams illustrating the wafer states during the first coating processing and the second coating processing.

Now, the details of the first coating control in the process S05 will be described. As illustrated in FIG. 12, the control unit 100 first performs a process S41. In the process S41, the first coating control unit 115 controls the rotating/holding unit 20 to change the rotation speed of the wafer W from the first rotation speed ω1 to a third rotation speed ω3 (see FIG. 14A).

The third rotation speed ω3 is set to allow the mixed solution 213 to be diffused toward the edge Wb of the wafer W without allowing the resist liquid 211 to be diffused toward the edge Wb of the wafer W. For example, the third rotation speed ω3 is set to be in the range from 100 rpm to 500 rpm, or may be in the range from 200 rpm to 400 rpm. The first coating control unit 115 may control the rotating/holding unit 20 to change the rotation speed of the wafer W gradually from the first rotation speed ω1 to the third rotation speed ω3.

Subsequently, the control unit 100 performs a process S42. In the process S42, the first coating control unit 115 waits until a predetermined time passes by. In the meanwhile, the mixed solution 213 at the edge portion 221b of the liquid puddle 221 is coated while being diffused toward the edge Wb of the wafer W (see FIG. 14A). The predetermined time is set through previous conditions such that the mixed solution 213 is sufficiently diffused to be coated. Through the above-described processes, the first coating control is completed.

(Second Coating Control)

Figure 13:
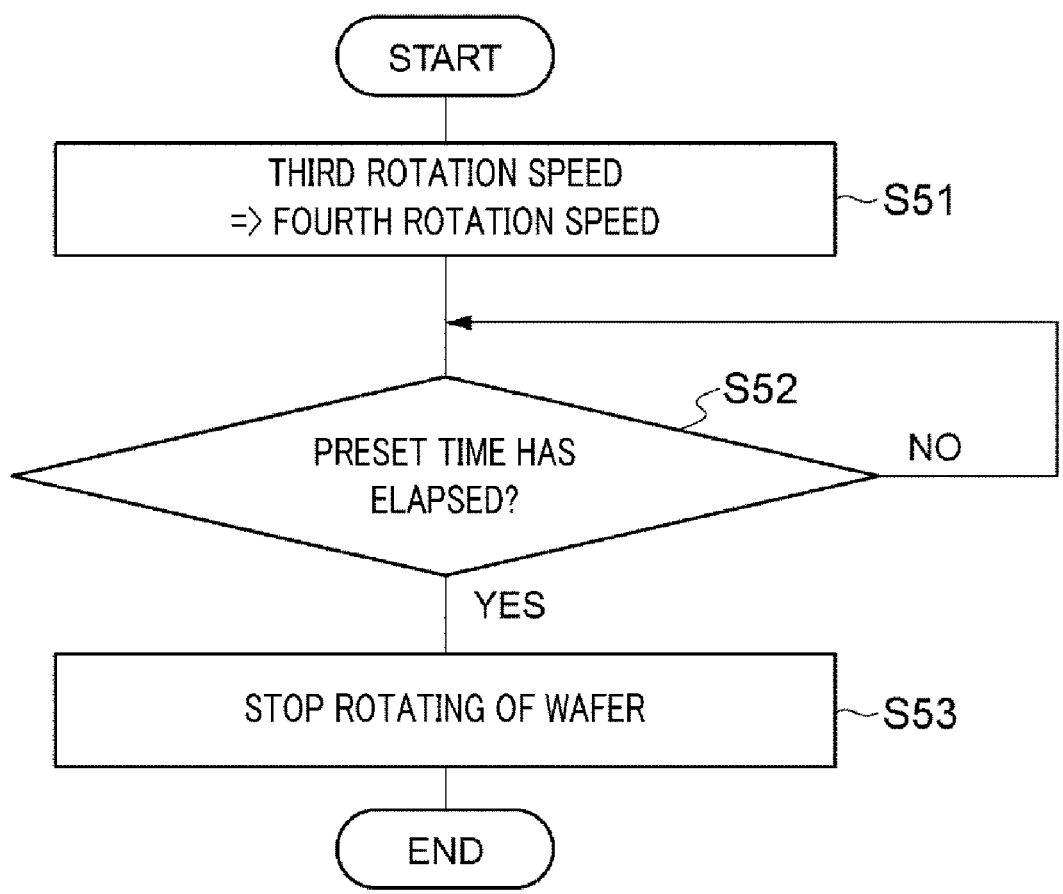
FIG. 13 is a flowchart illustrating a sequence of a second coating processing.
Figure 14B:
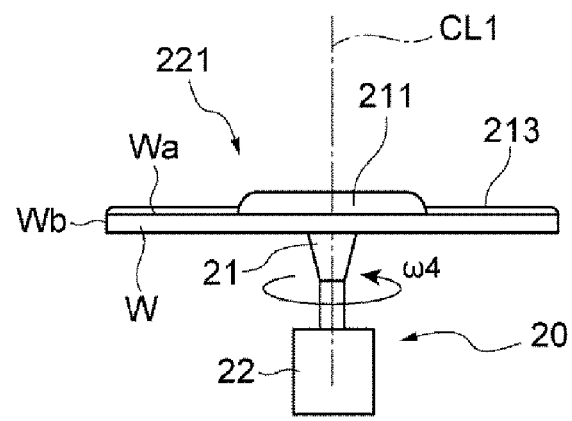

Now, the details of the second coating control in the process S06 will be explained. As depicted in FIG. 13, the control unit 100 first performs a process S51. In the process S51, the second coating control unit 116 controls the rotating/holding unit 20 to change the rotation speed of the wafer W from the third rotation speed ω3 to a fourth rotation speed ω4 (see FIG. 14B).

The fourth rotation speed ω4 is set to allow the resist liquid 211 to be diffused toward the edge Wb of the wafer W. By way of example, the fourth rotation speed ω4 is set to range from 400 rpm to 1200 rpm, or may be in the range from 600 rpm to 1000 rpm. The second coating control unit 116 may control the rotating/holding unit 20 to change the rotation speed of the wafer W gradually from the third rotation speed ω3 to the fourth rotation speed ω4.

Figure 14C:
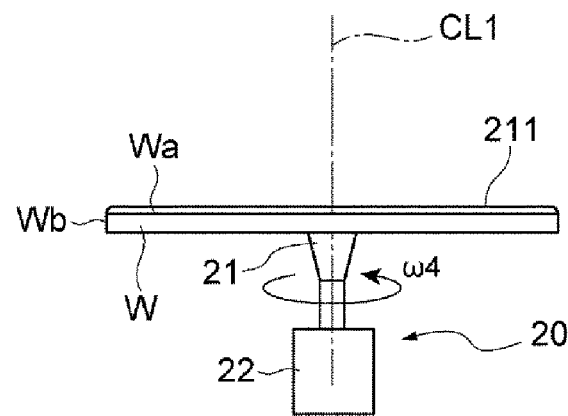

Then, the control unit 100 performs a process S52. In the process S52, the second coating control unit 116 waits for a lapse of a preset time. In the meanwhile, the resist liquid 211 of the liquid puddle 221 is coated while being diffused toward the edge Wb of the wafer W (see FIG. 14B). The preset time is set through previous conditions such that resist liquid 211 is sufficiently diffused to be coated. Through the above-described processes, the second coating control is accomplished, so that a liquid film of the resist liquid 211 is formed (see FIG. 14C).

Effects of the Present Exemplary Embodiment

As stated above, the coating sequence includes supplying a resist liquid onto a surface of a wafer under a condition that a liquid puddle of the resist liquid is formed at a central portion of the surface of the wafer; supplying, while rotating the wafer at a first rotation speed set to allow the liquid puddle to stay at an inner side than an edge of the wafer, a diluting liquid onto the surface of the wafer and moving a supply position of the diluting liquid from an outside of the liquid puddle to an edge portion of the liquid puddle; moving, after the moving of the supply position of the diluting liquid from the outside of the liquid puddle to the edge portion of the liquid puddle, the supply position of the diluting liquid from the edge portion of the liquid puddle to the outside of the liquid puddle while continuing to rotate the wafer at the first rotation speed; and rotating, after the moving of the supply position of the diluting liquid from the edge portion of the liquid puddle to the outside of the liquid puddle, the wafer at a rotation speed higher than the first rotation speed to allow the resist liquid to be diffused toward the edge of the wafer.

According to this coating method, after the liquid puddle of the resist liquid is formed at the central portion of the surface of the wafer, the arrival position of the diluting liquid gradually advances from the outside of the liquid puddle into the edge portion of the liquid puddle, and, afterwards, gradually retreats from the edge portion of the liquid puddle to the outside thereof. Accordingly, the edge portion of the liquid puddle can be diluted with high uniformity. Thereafter, as the wafer is rotated at the rotation speed higher than the first rotation speed, the mixed solution at the edge portion of the liquid puddle is diffused toward the edge of the wafer, and the resist liquid of the liquid puddle is diffused toward the edge of the wafer additionally. As stated above, since the edge portion of the liquid puddle is diluted with high uniformity and viscosity of the mixed solution is lower than that of the resist liquid, the mixed solution is diffused toward the edge of the wafer with high uniformity. By being guided by this mixed solution, the resist liquid is also diffused toward the edge of the wafer with high uniformity. Therefore, this coating method is advantages when it is applied to form the liquid film on the surface of the wafer with high film thickness uniformity.

The forming of the liquid puddle of the resist liquid at the central portion of the surface of the wafer may include supplying, while rotating the wafer at a second rotation speed equal to or higher than the first rotation speed, the resist liquid onto the surface of the wafer under a condition that the liquid puddle of the resist liquid is formed at a first region including a rotation center of the wafer and the resist liquid is suppressed from adhering to a second region at an outer side than the first region. The moving of the supply position of the diluting liquid from the outside of the liquid puddle to the edge portion of the liquid puddle may include moving the supply position of the diluting liquid from the second region to an edge portion of the first region. The moving of the supply position of the diluting liquid from the edge portion of the liquid puddle to the outside of the liquid puddle may include moving the supply position of the diluting liquid from the edge portion of the first region to the second region. In this case, by forming the liquid puddle of the resist liquid on the surface of the wafer while rotating the wafer at the second rotation speed, the liquid puddle having high uniformity in the circumferential direction can be formed at the first region. Further, by setting the first rotation speed, that is, the wafer rotation speed when the supply position of the diluting liquid is moved to be equal to or less than the second rotation speed, that is, the wafer rotation speed when the liquid puddle of the resist liquid is formed, the diffusion of the resist liquid can be more securely suppressed while the supply position of the diluting liquid is moved. Therefore, the liquid puddle having the high uniformity in the circumferential direction can be maintained. As a result, when the arrival position of the diluting liquid advances into the first region from the second region, the edge portion of the liquid puddle can be diluted with higher uniformity.

The rotating, after the moving of the supply position of the diluting liquid from the edge portion of the liquid puddle to the outside of the liquid puddle, of the wafer at the rotation speed higher than the first rotation speed may include rotating the wafer at a third rotation speed which is higher than the first rotation speed and allows a mixed solution of the resist liquid and the diluting liquid to be diffused toward the edge of the wafer, and rotating, after the rotating of the wafer at the third rotation speed, the wafer at a fourth rotation speed which is higher than the third rotation speed and allows the resist liquid to be diffused toward the edge of the wafer. In this case, by increasing the rotation speed in stages, the phenomenon that the mixed solution is first diffused to guide the resist liquid can occur more conspicuous.

A supply of the diluting liquid onto a position at the inner side than the edge of the wafer may be started before the moving of the supply position of the diluting liquid from the second region to the edge portion of the first region. In this case, as compared to the case of starting the supply of the diluting liquid at an outer side than the edge of the wafer, a moving distance for allowing the supply position of the diluting liquid to be advanced into the first region can be shortened. Therefore, a processing time can be reduced.

The supply of the diluting liquid may be started while controlling the rotating holding unit to set the rotation speed of the wafer to be a fifth rotation speed lower than the first rotation speed. In this case, splash of the liquid can be suppressed when the diluting liquid first arrives at the wafer, and occurrence of an unexpected phenomenon, e.g., the splashed diluting liquid is mixed into the liquid puddle or the like, can be suppressed.

The wafer may be rotated at the fifth rotation speed one or more rounds after the supply of the diluting liquid is started and before the moving of the supply position of the diluting liquid is started. In this case, a coating state of the diluting liquid onto the second region in the circumferential direction can be suppressed from being non-uniform. Therefore, when the wafer is rotated at the third rotation speed, the mixed solution can be diffused toward the edge of the wafer with higher uniformity.

After the moving of the supply position of the diluting liquid from the edge portion of the first region to the second region, the supply of the diluting liquid may be stopped in a state that the supply position of the diluting liquid is located at the inner side than the edge of the wafer. In this case, as compared to the case of stopping the supply of the diluting liquid at an outer side than the edge of the wafer, a moving distance for allowing the supply position of the diluting liquid to be retreated from the first region can be shortened. Therefore, the processing time can be further reduced.

The supply of the resist liquid onto the surface of the wafer may be started in a state that the surface of the wafer is dried, and the supply of the diluting liquid may be started in a state that the second region is dried. In this case, as compared to the case of supplying the resist liquid in the state that the surface of the wafer is wet, uniformity of a radius (a distance from the rotation center of the wafer to the edge of the liquid puddle) of the liquid puddle in the circumferential direction can be improved. As a result, the uniformity of the film thickness of the liquid film can be further improved.

So far, the exemplary embodiment of the present disclosure has been described. However, the exemplary embodiment is not anyway limiting and can be changed and modified in various ways without departing from the technical scope thereof. By way of example, the coating sequence is also applicable to a coating processing of forming a film (for example, the bottom film or the top film) besides the resist film. The substrate as the processing target object may not be limited to the semiconductor wafer but may be, by way of non-limiting example, a glass substrate, a mask substrate, a FPD (Flat Panel Display), or the like.

EXAMPLES

Now, an experiment example and a comparative example will be described. Here, the experimental example is just an example of the exemplary embodiment and is not anyway limiting.

[Preparation of Sample]

Experimental Example

A silicon wafer having a diameter of 300 mm is prepared, and a resist film having a thickness of about 60 μm is formed on a surface of the silicon wafer through the coating sequence of the processes S01 to S07 and a subsequent heat treatment. Conditions for this experimental example are as follows.

Viscosity of resist liquid: 4000 cP
Radius of liquid film: about 70 mm
Resist liquid supply start position: 80 mm from the rotation center
Preset position in process S27: 60 mm from the rotation center
Second rotation speed: 150 rpm
First rotation speed: 60 rpm
Third rotation speed: 300 rpm
Fourth rotation speed: 800 rpm
Fifth rotation speed: 10 rpm
First moving speed: 10 mm/s
Second moving speed: 10 mm/s
Heating condition after the coating processing: heat treatment at 130° C. for 600 seconds Comparative Example A silicon wafer having a diameter of 300 mm is prepared. While rotating the silicon wafer at 800 rpm, a coating processing is performed by supplying the same resist liquid as that used in the experimental example onto a rotation center of the silicon wafer. Then, by performing a heat treatment under the same condition as that of the experimental example, a resist film having a thickness of about 60 μm is formed.

[Evaluation of Uniformity of Film Thickness]

Film thicknesses of the resist film is measured on the entire region of the silicon wafer, and an evaluation value of uniformity of the film thickness is calculated based on the following equation.

Evaluation value=(maximum film thickness−minimum film thickness)/(average film thickness×2)×100

The evaluation value of the comparative example is 12.95%, whereas the evaluation value of the experimental example is 3.8%. From this result, it is found out that the coating sequence of the processes S01 to S07 is effective in improving the film thickness uniformity.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

I claim:
1. A coating method, comprising:
(a) forming a liquid puddle of a processing liquid having viscosity ranging from 1000 cP to 7000 cP at a central portion of a surface of a substrate by supplying the processing liquid onto the surface of the substrate and, after a preset time, stopping the supplying of the processing liquid;
(b) after the forming of the liquid puddle of the processing liquid and after the stopping of the supplying of the processing liquid, starting to supply, while rotating the substrate at a first rotation speed set to allow the liquid puddle to stay at an inner side than an edge of the substrate, a diluting liquid to an outside of the liquid puddle and onto the surface of the substrate and moving a supply position of the diluting liquid from the outside of the liquid puddle to an edge portion of the liquid puddle such that the supplied diluting liquid directly contacts the liquid puddle;
(c) after the moving of the supply position of the diluting liquid from the outside of the liquid puddle to the edge portion of the liquid puddle, moving the supply position of the diluting liquid from the edge portion of the liquid puddle to the outside of the liquid puddle while continuing to rotate the substrate at the first rotation speed; and
(d) after the moving of the supply position of the diluting liquid from the edge portion of the liquid puddle to the outside of the liquid puddle, stopping the supplying of the diluting liquid and rotating the substrate at a rotation speed higher than the first rotation speed to allow the processing liquid to be diffused toward the edge of the substrate,
wherein the supplying of the diluting liquid is continuously performed from when the supplying of the diluting liquid is started in step (b) until the supplying of the diluting liquid is stopped in step (d).

2. The coating method of claim 1,
wherein the forming of the liquid puddle of the processing liquid at the central portion of the surface of the substrate comprises supplying, while rotating the substrate at a second rotation speed equal to or higher than the first rotation speed, the processing liquid onto the surface of the substrate under a condition that the liquid puddle of the processing liquid is formed at a first region including a rotation center of the substrate and the processing liquid is suppressed from adhering to a second region at an outer side than the first region, the moving of the supply position of the diluting liquid from the outside of the liquid puddle to the edge portion of the liquid puddle comprises moving the supply position of the diluting liquid from the second region to an edge portion of the first region, and the moving of the supply position of the diluting liquid from the edge portion of the liquid puddle to the outside of the liquid puddle comprises moving the supply position of the diluting liquid from the edge portion of the first region to the second region.

3. The coating method of claim 2,
wherein the rotating, after the moving of the supply position of the diluting liquid from the edge portion of the liquid puddle to the outside of the liquid puddle, of the substrate at the rotation speed higher than the first rotation speed comprises:

rotating the substrate at a third rotation speed which is higher than the first rotation speed and allows a mixed solution of the processing liquid and the diluting liquid to be diffused toward the edge of the substrate, and rotating, after the rotating of the substrate at the third rotation speed, the substrate at a fourth rotation speed which is higher than the third rotation speed and allows the processing liquid to be diffused toward the edge of the substrate.

4. The coating method of claim 2,
wherein a supply of the diluting liquid onto a position at the inner side than the edge of the substrate is started before the moving of the supply position of the diluting liquid from the second region to the edge portion of the first region.

5. The coating method of claim 4,
wherein the supply of the diluting liquid is started after setting the rotation speed of the substrate to be a fifth rotation speed lower than the first rotation speed.

6. The coating method of claim 5,
wherein the substrate is rotated at the fifth rotation speed one or more rounds after the supply of the diluting liquid is started and before the moving of the supply position of the diluting liquid is started.

7. The coating method of claim 4,
wherein, after the moving of the supply position of the diluting liquid from the edge portion of the first region to the second region, the supply of the diluting liquid is stopped in a state that the supply position of the diluting liquid is located at the inner side than the edge of the substrate.

8. The coating method of claim 4,
wherein the supply of the processing liquid onto the surface of the substrate is started in a state that the surface of the substrate is dried, and the supply of the diluting liquid is started in a state that the second region is dried.

\* \* \* \* \*